(12) United States Patent
Mulder et al.

(10) Patent No.: US 6,862,076 B2
(45) Date of Patent: Mar. 1, 2005

(54) METHOD OF DETERMINING STRAY RADIATION LITHOGRAPHIC PROJECTION APPARATUS

(75) Inventors: Heine Melle Mulder, Eindhoven (NL); Marco Hugo Petrus Moers, Best (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/684,826

(22) Filed: Oct. 15, 2003

(65) Prior Publication Data

US 2004/0160588 A1 Aug. 19, 2004

Related U.S. Application Data

(60) Provisional application No. 60/419,110, filed on Oct. 18, 2002.

(51) Int. Cl.[7] .................. G03B 27/32; G03B 27/52; G03B 27/54
(52) U.S. Cl. ................. 355/40; 355/67; 355/77
(58) Field of Search ................ 355/40, 41, 53, 355/67, 68, 97, 77

(56) References Cited

U.S. PATENT DOCUMENTS 6,716,646 B1 * 4/2004 Wright et al. .............. 438/14

2003/0169345 A1 * 9/2003 Rykowski et al. ..... 348/207.99

OTHER PUBLICATIONS

Joseph P. Kirk, "Scattered Light in Photolithographic Lenses", Optical/Laser Microlithography VII (1994), SPIE vol. 2197, pp. 566–572.

* cited by examiner

*Primary Examiner*—Rodney Fuller
(74) *Attorney, Agent, or Firm*—Pillsbury Winthrop LLP

(57) ABSTRACT

A system and method for determining the stray radiation condition of a projection system, is presented herein. The invention includes providing a detector with a detector aperture coincident with the image plane of the projection system, measuring a reference parameter in accordance with the projection beam intensity, measuring a stray radiation parameter of an image of an isolated feature and calculating a coefficient representative of the stray radiation condition of the projection system based on the measured stray radiation parameter and the reference parameter. The extent of the detector aperture fits within the extent of a notional shape, which is defined by first scaling down the shape of the feature and subsequently displacing each line element constituting the edge of the scaled down shape, parallel to itself, over a distance of at least $\lambda/NA$ in a direction perpendicular to that line element.

11 Claims, 4 Drawing Sheets

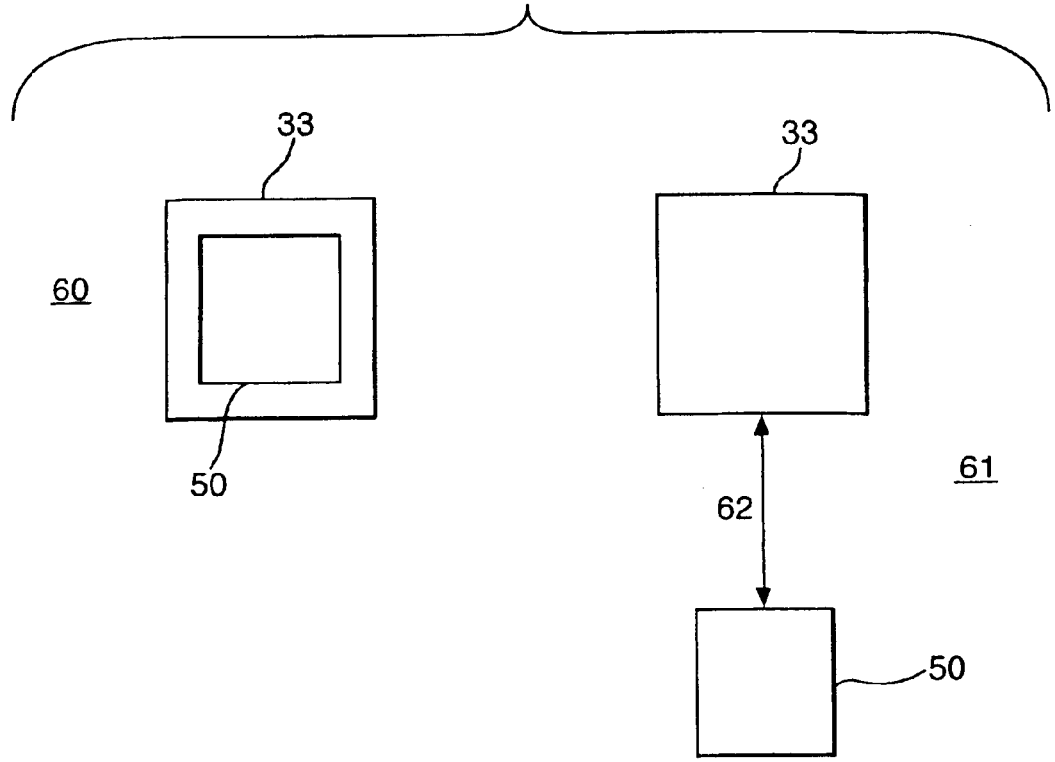
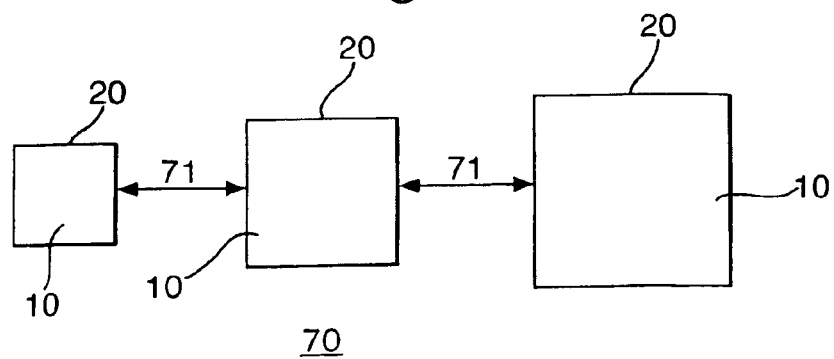

METHOD OF DETERMINING STRAY RADIATION LITHOGRAPHIC PROJECTION APPARATUS

This application claims priority from U.S. patent application No. 60/419,110, filed Oct. 18, 2002, herein incorporated by reference in its entirety.

BACKGROUND OF THE INVENTION

1. Field of the Invention

The present invention relates to lithographic projection apparatus and more particularly to the determination of stray radiation condition therein.

2. Description of the Related Art

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 007-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

There is a need to produce smaller and smaller semiconductor devices, and thus a corresponding need to provide projection systems enabling projection of features with smaller critical dimension ("CD"). Thus, these lithography apparatus are being pushed to their resolution limits, while maintaining sufficient "process latitude" (i.e., sufficient depth of focus and sufficient insensitivity to residual errors in the dose of exposure of irradiated target portions). Therefore, there is a need to minimize factors which can affect the resolution of the apparatus and the process latitude, and consequently there is a need to provide accurate monitoring means to monitor these factors.

Many different factors can affect the smallest CD and the process latitude for a given lithographic projection apparatus, such as, for example, residual aberrations of the projection system, focus and dose errors, and the occurrence of stray radiation. In particular, the more stray radiation is present in the image of a pattern projected by the projection system, the less resolution can be obtained, and the smaller the process latitude will be. Stray radiation may, for example, be caused by scattering of projection beam radiation at contaminating particles and/or defects on surfaces of optical elements of the projection system. Also, optical elements provided with anti-reflection coatings may cause stray radiation due to degradation of materials used for the anti-reflection coatings. Degradation of materials may be a radiation induced effect, and like the number of contaminating particles and/or defects it may increase as a function of time. The word "condition" in the expression "a stray radiation condition," as used above, refers to a momentary state of the presence of stray radiation causing effects in the projection system. The stray radiation condition is typically a time-dependent quantity. When the amount of stray radiation increases, the stray radiation condition deteriorates.

To more precisely assess the stray radiation condition of a projection system, it is useful to identify "ranges" of stray radiation. A point in the object plane and irradiated by radiation of the projection beam is traversed by rays of the projection beam. These rays subsequently traverse the projection system whereby a sub-set of the rays is diverted due to scattering. This sub-set of rays intersect a plane conjugated to the object plane (referred to hereinafter as "image plane") in an area comprising the geometrical image of said point at a corresponding subset of distances from that geometrical image point. The distances can be ordered into ranges of distances, and these ranges constitute "ranges" of stray radiation. Generally, the projection beam of radiation provided by the radiation system is such that the rays traversing said point in the object plane are symmetrically distributed with respect to the optical axis of the projection apparatus.

However, despite this situation, the spatial intensity distribution of the stray radiation in the image plane may not be symmetric with respect to the geometrical image point. Thus, the range of stray radiation may be an asymmetric function of X and Y coordinates of a Cartesian coordinate system in the image plane with its origin 0 coincident with the geometric image point. This may be indicative for a certain class of defects in the projection system.

Measures for stray radiation in different ranges can be used in a simulator to estimate the degradation of CD, and hence to estimate the effect on the resolution performance of the lithographic projection apparatus. The resolution performance can become out of tolerance and therefore there is the problem of accurately monitoring stray radiation for different ranges, so that preventive measures such as cleaning lens surfaces can be taken in time. Further, although lithographic projection apparatus are generally provided with means to measure resolution performance, it is not possible from such measurements to assess in situ and sufficiently fast the presence of stray radiation in different ranges and to assess the necessity of taking appropriate measures to reduce stray radiation.

SUMMARY OF THE INVENTION

Systems, apparatuses and methods consistent with the principles of the present invention, as embodied and broadly described herein, provide for determining stray radiation condition in a lithographic projection apparatus. One embodiment of the present invention comprises supplying a projection beam of radiation a wavelength $\lambda$, patterning the projection beam according to a pattern comprising a predetermined feature, and projecting the patterned beam onto an image plane to create an image of the predetermined feature. The embodiment further comprising providing a detector, having a detector aperture, in a path traversed by the projection beam, positioning the detector aperture into a position which is substantially coincident with the image plane, wherein an expanded area obtained by a notional dilatation over a distance of at least $\lambda/NA$ of the detector aperture is covered by the predetermined feature image, measuring detected radiation intensity, and calculating a coefficient representative of the stray radiation condition of the projection system based on the measured radiation intensity.

In another embodiment, the present invention comprises a radiation system that supplies a projection beam of radiation having wavelength $\lambda$, a support structure that supports a patterning device configured to pattern the projection beam based on a desired pattern, a substrate table for holding a substrate, and a projection system, with a numerical aperture NA, that projects said patterned beam onto a target portion of said substrate and to create an image of the pattern. The embodiment further comprises a detector provided with a detector aperture containing one or more transmissive areas in accordance with the image of one or more features of the pattern, wherein the image of the one or more features is substantially congruent to one or more expanded areas of the detector aperture obtained by a notional dilatation over a distance of at least $\lambda/NA$ of the one or more transmissive areas, a memory device to store parameters representative of stray radiation, and a processor to calculate a stray radiation condition of the projection system.

The invention is based on the insight that, in the absence of scattering of radiation due to, for example, contaminating particles, a plurality of rays of the projection beam traversing a point in the object plane, and subsequently traversing the projection system, intersect the image plane in an area comprising the geometrical image of said point at a corresponding plurality of distances from that geometrical image point, where due to diffraction and the presence of residual aberration in the projection system, the distances typically range from zero to about a distance of $\lambda/NA$ $\mu$m (with the wavelength $\lambda$ given in $\mu$m).

Radiation traversing the image plane at distances from the geometrical image point greater than $\lambda/NA$ is typically primarily due to scattering. As a consequence, an image of a pattern or a test pattern featuring a transmissive area surrounding an opaque feature consists of an area exposed to radiation of the projection beam which comprises a substantially unexposed area of the same shape as the shape of the opaque feature, scaled down by the factor M. The radiation traversing the substantially unexposed area at a distance greater than $\lambda/NA$ away from the edge of the exposed area is primarily stray radiation. So, any area comprised by the substantially unexposed area and having a notional shape, defined by first scaling down the shape of said feature by the factor M, and by subsequently displacing each line element constituting the edge of the scaled down shape, parallel to itself, over a distance of at least $\lambda/NA$ in a direction perpendicular to that line element, is traversed primarily by stray radiation.

Therefore a detector with a detector aperture whose extent fits within or matches to said notional shape can be used to measure stray radiation by positioning the detector aperture within the image of the feature and measuring the stray radiation. This enables a fast, in situ, real time assessment of the stray radiation condition of the projection system. The detector aperture can be, for example, the edge of the radiation sensitive surface of the detector, or a diaphragm placed on top of this surface and limiting the extent of the detector surface which can be exposed to radiation, or—similarly—any partially or substantially transmissive part or area of a substantially radiation blocking screen placed proximate to the detector surface. The situation whereby the extent of the detector aperture fits within or matches to said notional shape can be realized by shaping the transmissive area or opening of the detector aperture such that an expanded area of the detector aperture obtained by a notional dilatation over a distance of at least $\lambda/NA$ of said detector aperture is covered by or matches to the image of said feature or when—vice versa—the feature is shaped such that its image covers or matches said expanded area.

The signal provided by the detector in response to the detected stray radiation intensity is a stray radiation parameter of the image of the isolated area and its value may serve as a coefficient representative for stray radiation and of the stray radiation condition of the projection system. Preferably, a coefficient representative of the stray radiation condition of the projection system can be obtained by normalizing the measured stray radiation intensity with a signal that is referred to hereinafter as a reference signal, representative for radiation intensity in the image plane in the absence of a pattern. This signal is provided, for example, by the detector in response to detection of radiation intensity in an exposed area in the image plane chosen sufficiently far away from images of any test patterns such as to avoid effects due to the presence of the test patterns.

Preferably the predetermined feature is embodied as an isolated area that contrasts with an area of the pattern comprising said isolated area. Here, the term "contrast" refers to having a patterning effect on radiation of the projection beam. For example, contrasting isolated areas may be embodied as opaque or reflecting chromium areas on a surface of a substantially transparent reticle, or as substantially transmissive areas in a radiation blocking or reflecting chromium coating covering a reticle surface. Also, in analogy with attenuated phase shift masks, the transmittance and/or the phase shifting properties of isolated areas may differ from the transmittance and/or the phase shifting property of an area comprising said isolated areas, for example. An advantage of using an isolated test feature is that the measurement of stray radiation is less sensitive to possible asymmetry of the spatial intensity distribution of the stray radiation in the image plane with respect to a geometrical image point.

In a further embodiment, the shape of an expanded area obtained by a notional dilatation over a distance of at least $\lambda/NA$ of the detector aperture is congruent to the image of the feature or isolated area as projected and imaged at magnification M by the projection system, and said positioning step further comprises an alignment step for angularly aligning the detector aperture with the isolated area. As a result control is provided over the average distance between the edge of the detector aperture and the edge marking the transition from the exposed to the substantially unexposed area. This in turn provides control over the range of stray radiation that is measured. In the present text, two areas of equal shape are said to be "angularly aligned" when the two shapes can be brought in overlap by exclusively scaling and/or laterally translating one area with respect to the other area.

In another embodiment the alignment step further comprises a centering step for laterally centering the detector aperture with respect to the image of the isolated area. Consequently, the average distance between the edge of the detector aperture and the edge marking the transition from the exposed to the substantially unexposed area is substantially constant. In the present example the range of stray radiation detected is limited at the low end by this average distance and since this average distance is substantially constant the range of detected stray radiation is well defined. An additional advantage of the present method is that extremely short range stray radiation, i.e. of ranges just exceeding $\lambda/NA$, can be measured.

Alternatively, in any of the above described situations, the isolated area may be transmissive, and be comprised within an opaque area. Then, in a similar way, the range of stray radiation detected is zero at the low end and limited at the high end by, for example, said average distance.

In an embodiment of the invention the test pattern comprises a plurality of isolated areas for measuring a corresponding plurality of stray radiation parameters. An advantage is now that a more detailed analysis of the stray radiation condition of the projection system can be obtained, for example in terms of stray radiation of different ranges and/or stray radiation for different points in the field of the projection system (by providing isolated areas at different lateral positions on the mask). The more detailed analysis can be done in situ, and sufficiently fast such as to allow for intermittent checks on stray radiation during usage of the apparatus.

The plurality of features preferably comprises a one or two dimensional array or set of identical features such as, for example, opaque lines of a grating, or square, opaque areas of a checkerboard type array of isolated areas. An advantage of such an embodiment is that the sensitivity of the measurement can be increased, or that existing detectors (provided, for example, for alignment measurement or for aberration measurement) can be used. Preferably, a coefficient representative of the stray radiation condition of the projection system can be obtained by normalizing the measured stray radiation intensity—as described above—with a reference signal representative for radiation intensity in the image plane in the absence of a pattern.

In accordance with an embodiment of the invention, the detector with a detector aperture embodied for real-time detection of stray radiation impinging on the target portion is provided on the substrate table. An advantage is that the positioning means of the alignment system can be used to align and position the detector according to the method described above, so that no separate positioning means for this purpose have to be provided. A further advantage is that the inherent accuracy of the positioning means of the alignment system (needed for aligning subsequent IC layers as explained above) can be exploited for accurately controlling the lower limit of the range of stray radiation to be measured (this lower limit is of the order of $\lambda/NA$ µm).

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm).

BRIEF DESCRIPTION OF THE DRAWINGS

Embodiments of the invention will now be described, by way of example only, with reference to the accompanying schematic drawings in which:

FIG. 4 illustrates positions of the detector for measurement of a stray radiation parameter and a reference parameter in accordance with an embodiment of the present invention;

FIG. 5 illustrates the use of a plurality of isolated areas in accordance with an embodiment of the present invention;

In the figures, corresponding reference symbols indicate corresponding parts.

DETAILED DESCRIPTION

Embodiment 1

Figure 1:
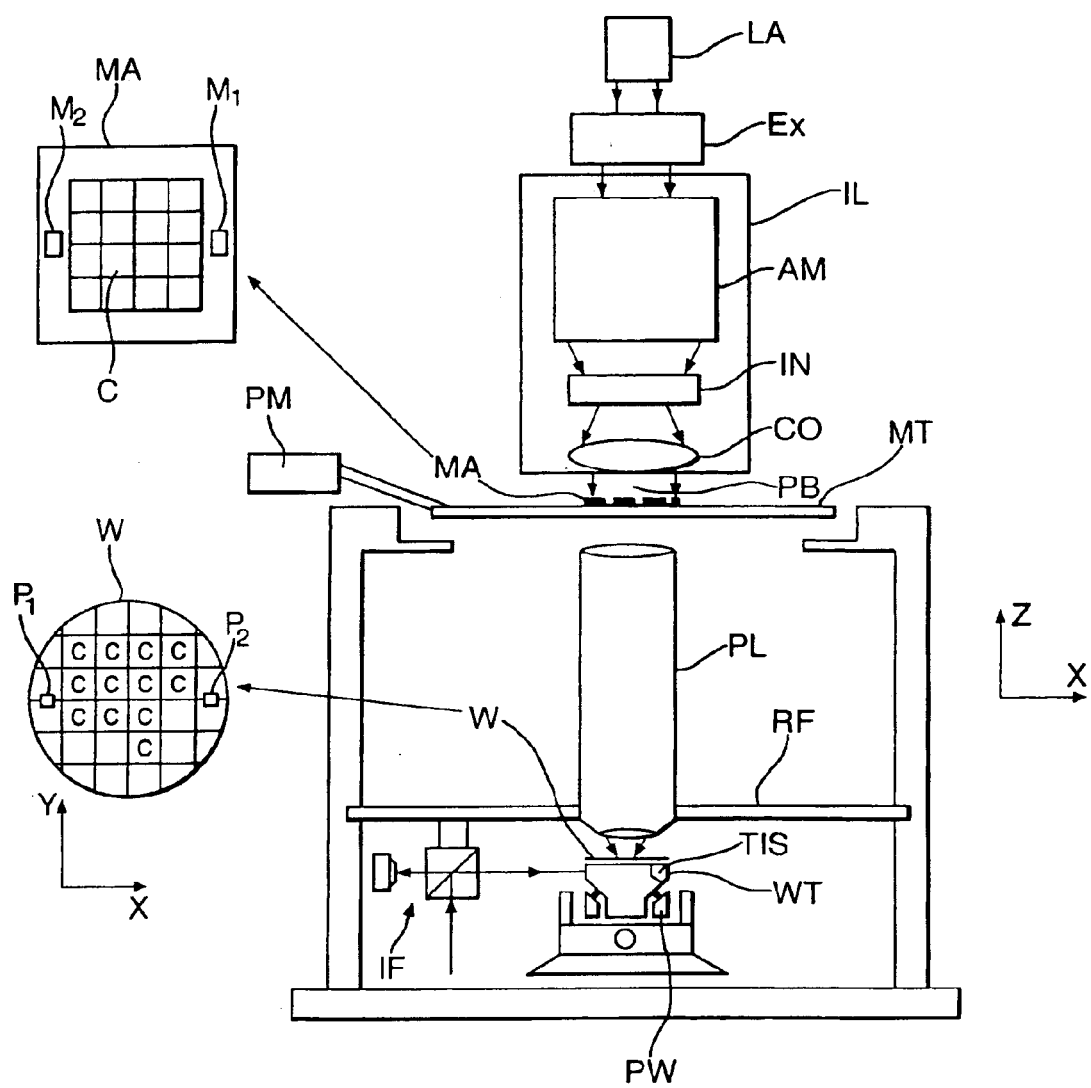
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL: for supplying a projection beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source LA;

a first object table (mask table) MT: provided with a mask holder for holding a mask MA (e.g. a reticle), and connected to first positioning means PM for accurately positioning the mask with respect to item PL;

a second object table (substrate table) WT: provided with a substrate holder for holding a substrate W (e.g. a resist-coated silicon wafer), and connected to second positioning means PW for accurately positioning the substrate with respect to item PL; and a projection system ("lens") PL: (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

A transmission image sensor TIS can be used to determine the lateral position and best focus position (i.e. horizontal and vertical position) of the projected image from the mask under the projection lens. A transmission image sensor TIS is inset into a physical reference surface associated with the substrate table WT. In a particular embodiment, two sensors are mounted on fiducial plates mounted to the top surface of the substrate table WT, at diagonally opposite positions outside the area covered by the wafer W. Each fiducial plate is made of a highly stable material with a very low coefficient of thermal expansion, e.g. Invar, and has a flat reflective upper surface which may carry markers used with another fiducial in alignment processes. The TIS is used to determine directly the vertical (and horizontal) position of the aerial image of the projection lens. It comprises apertures in the respective surface close behind which is placed a photodetector sensitive to the radiation used for the exposure process.

To determine the position of the focal plane, the projection lens projects into space an image of a pattern provided on the mask MA and having contrasting light and dark regions. The substrate table is then scanned horizontally (in one or preferably two directions) and vertically so that the aperture of the TIS passes through the space where the aerial image is expected to be. As the TIS aperture passes through the light and dark portions of the image of the TIS pattern, the output of the photodetector will fluctuate (a Moiré effect). The vertical level at which the rate of change of amplitude of the photodetector output is highest indicates the level at which the pattern image has the greatest contrast, and hence indicates the plane of optimum focus. The horizontal level at which the rate of change is highest indicates the aerial image's lateral position. An example of a TIS of this type is described in greater detail in U.S. Pat. No. 4,540,277, incorporated herein by reference. Advantages of TIS include robustness and speed, because it is a direct measurement technique not involving exposure of a resist.

According to one embodiment, a spot sensor is used, which is part of the TIS. The spot sensor comprises a photodiode with an extremely small detection area. However, any other suitable spot sensor, comprising a radiation sensor with small detection area, could be used apart from sensors associated with TIS. One specific TIS comprises a square detector aperture with dimensions 28 μm×28 μm in front of a photodiode.

Figure 2:
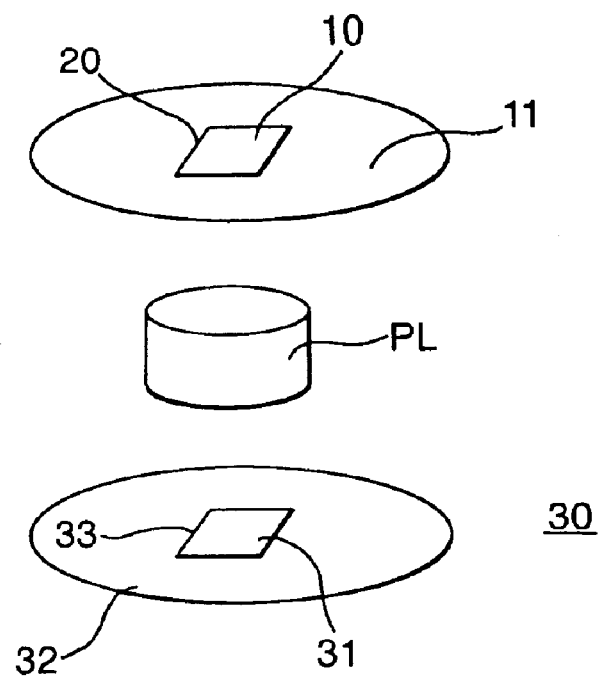
FIG. 2 depicts an isolated area surrounded by a contrasting area and the resulting image as projected by a projection system in accordance with an embodiment of the present invention.
Figure 3:
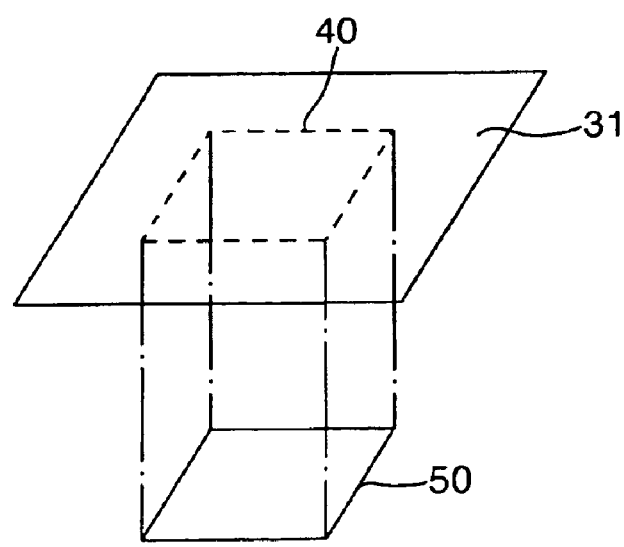
FIG. 3 depicts a detector aperture angularly and laterally aligned with an image of an isolated area in accordance with an embodiment of the present invention.

In one embodiment, the mean wavelength of the projection beam is 248 nm, and the NA of a patterned beam impinging on the image plane is 0.7. Further, the test pattern for measuring stray radiation comprises a square opaque area 10 with sides 20 with a length SO, as illustrated in FIG. 2. The opaque area is comprised within a transmissive area 11. The geometrical image 30 of the opaque area is a square, substantially unexposed area 31 comprised within an exposed area 32. The sides 33 of the image of the opaque area 10 have a length SI given by the modulus value |M×SO|. For example, with SO=120 μm, and M=−0.25, we have SI=30 μm. As shown in FIG. 3 the shape of the square detector aperture of the TIS sensor, with sides 50 of a length SD of 28 μm, is congruent to a notional shape having an edge 40, which is obtained from the shape of the area 31 by displacing each line element constituting the shape of area 31, parallel to itself, over a distance of 1 μm.

Here, λ/NA is smaller than 1 μm: we have λ/NA=248/0.7=0.354 μm. So, when the detector aperture of the TIS is positioned such that its edge 50 coincides with the edge 40, stray radiation of a range greater that 1 μm is detected with the TIS sensor. For clarity, in FIG. 3 the edge 50 is schematically shown in a position separated from the edge 40. During measurement of stray radiation, the edges 40 and 50 preferably substantially coincide. In that case, the TIS detector aperture is angularly aligned with respect to the opaque area 10, and centered with respect to the image 30.

A measurement of a stray radiation condition of a projection system involves at least two subsequent measurements, whereby the detector aperture with its edge 50 is positioned in two different positions 60 and 61 with respect to the image of the opaque area with sides 33, see FIG. 4. In position 60, with the above-mentioned centered and aligned position, stray radiation is measured, and the signal generated by the detector in response to the impinging stray radiation is a stray radiation parameter S1. In position 61, the TIS sensor is irradiated directly by the projection beam; the detector signal S2 is the reference parameter to be used for normalizing S1, such that a stray radiation coefficient Co is obtained: Co=S1/S2.

As a first approximation, the coefficient Co is representative for stray radiation present in the range R given by R=[(½)×(SI−SD), infinity]; for one embodiment, the range is R=[1 μm, infinity]. Here, the term "infinity" is not to be taken literally, but to be understood to indicate that at the long end the range of stray radiation which can be detected is limited by the maximum size of a target portion that can be irradiated by the projection beam.

The distance 62 between the sides 33 of the image of the isolated area and the detector aperture 50 is indicated schematically by the arrow 62 in FIG. 4. This distance is larger than the extent of the side 33, such that the measurement is a good approximation and not affected by the presence of the substantially unexposed area comprised by the sides 33.

Embodiment 2

In an embodiment of the invention the test pattern comprises a series 70 of square, opaque isolated areas 10, with sides 20 of increasing length, as shown in FIG. 5. In this figure a series of three isolated areas is shown, which may for example be embodied to have a side length of respectively 160 μm, 252 μm, and 400 μm.

According to the first embodiment, stray radiation coefficients Co1, Co2 and Co3 representative, in a first approximation, for stray radiation in the ranges R1=[6 μm, infinity], R2=[17.5 μm, infinity], and R3=[36 μm, infinity] can be determined. Preferably, the test pattern comprises a plurality of series 70 at a corresponding plurality of positions in the field of the projection system, so that an assessment of the stray radiation condition of the projection system for different field positions can be made. Using the positioning means of the alignment system to subsequently position the detector aperture of the TIS at measurement positions 60 and 61, as defined with respect to each image 50 of the isolated area of the series 70, a fast in situ stray radiation condition determination is possible. The distance between the areas 10 is indicated schematically by the arrows 71 in FIG. 5. This distance may be much larger than the extent of the sides 20, such that stray radiation measurements are not affected by the presence of neighboring isolated areas.

Figure 6:
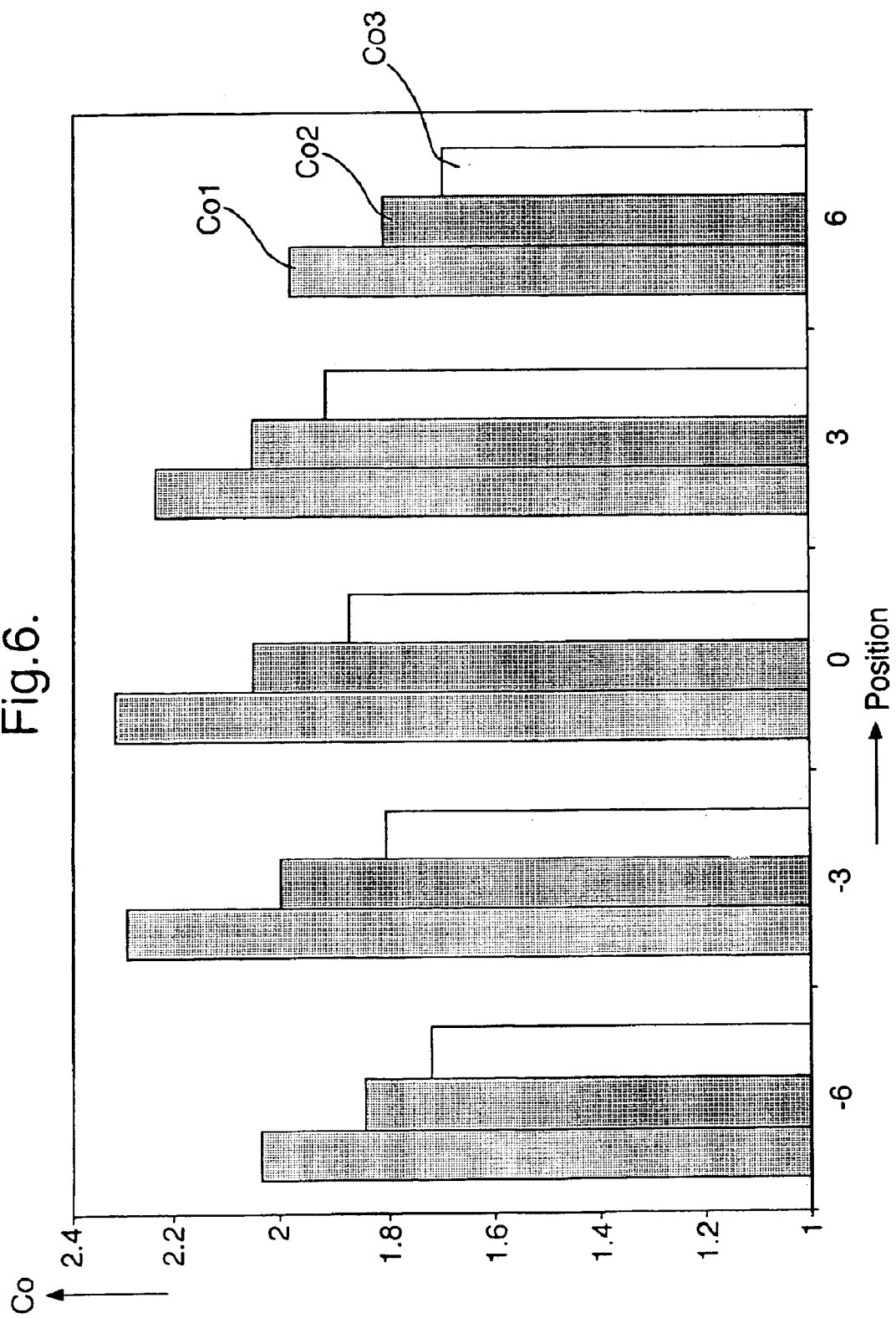
FIG. 6 shows the determination of a stray radiation condition of a projection system in which, in accordance with an embodiment of the present invention, the position in the field is indicated along the horizontal axis and the value of stray radiation coefficients is plotted along the vertical axis.

In FIG. 6, the result of such a determination is shown where the test pattern comprised five series 70 of three opaque isolated areas, at five positions in the field. The stray radiation coefficients Co1, Co2 and Co3 are plotted along the vertical axis; the position in the field is plotted along the horizontal axis.

Embodiment 3

This embodiment is similar to the first embodiment, except as indicated below. In this embodiment, the area 10 is transmissive, and the area 11 is opaque. Also, the test pattern comprises a transmissive area of sufficient size to enable a reference measurement of the projection beam radiation intensity in the absence of effects due to opaque areas. In this area, the detected signal is S2, as described in the first embodiment. The detected radiation intensity I2 in this area is the sum of a notional intensity I21 which would be present in the absence of stray radiation, and a contribution Isr due to stray radiation in a range Rref=[0 $\mu$m, infinity]: this contribution Isr is denoted as Isr2[0 $\mu$m, infinity] and I2=I21+Isr2[0 $\mu$m, infinity].

Similarly, in position 60, the detected radiation intensity I1 (provided as a signal S1) is the sum of said notional intensity I21 and a contribution Isr1[0 $\mu$m, (½)×(SI–SD) $\mu$m] due to stray radiation in the range R1=[0, (½)×(SI–SD) $\mu$m] and $$I1=I21+Isr1[0\ \mu m,\ (½)\times(SI-SD)\ \mu m]$$

The difference between the intensities I2 and I1 is given by:

$$I2-I1=Isr2[0\ \mu m,\ \text{infinity}]-Isr1[0\ \mu m,\ (½)\times(SI-SD)\ \mu m].$$

This difference is a measure for the stray radiation in the range R=[(½)×(SI–SD) $\mu$m, infinity]. Upon normalization by the reference parameter S2, a coefficient representative of the stray radiation condition is obtained. Thus, in this embodiment, the stray radiation coefficient Co representative for stray radiation in the range R=[(½)×(SI–SD) $\mu$m, infinity] is obtained according to the formula Co=(S2–S1)/S2. It is an alternative way to measure the same stray radiation coefficient as described in first embodiment.

Embodiment 4

A lithography projection apparatus provided with, for example, a discharge source for providing a projection beam of radiation with a mean wavelength of 13.6 nm, is typically featuring a projection system PL embodied as a mirror system. For determining a stray radiation condition of the mirror system, it is not necessary that the mean wavelength of the projection beam used for projecting the test pattern is also 13.6 nm. Since mirror systems are achromatic (i.e., the geometric optical imaging properties are wavelength independent), the projection beam used for projecting the test pattern may have other mean wavelengths, such as for example, a longer wavelength or a plurality of longer wavelengths. This enables an even more extensive stray radiation condition assessment of the projection system.

Whilst specific embodiments of the invention have been described above, it will be appreciated that the invention may be practiced otherwise than as described. The description is not intended to limit the invention.

What is claimed is:

1. A method of determining a stray radiation condition in a lithographic projection apparatus with a projection system having numerical aperture NA, the method comprising:

supplying a projection beam of radiation having wavelength $\lambda$;

patterning said projection beam according to a pattern comprising a predetermined feature;

projecting said patterned beam onto an image plane to create an image of said predetermined feature;

providing a detector, having a detector aperture, in a path traversed by said projection beam;

positioning said detector aperture into a position which is substantially coincident with the image plane, wherein an expanded area obtained by a notional dilatation over a distance of at least $\lambda/NA$ of said detector aperture is covered by said predetermined feature image;

measuring detected radiation intensity; and calculating a coefficient representative of the stray radiation condition of said projection system based on said measured radiation intensity.

2. A method according to claim 1, wherein said calculation of said stray radiation condition coefficient is further based on a reference signal representative of radiation intensity in the image plane in the absence of a pattern.

3. A method according to claim 2, wherein said predetermined feature is an isolated area that contrasts with an area of the pattern comprising said isolated area.

4. A method according to claim 3, wherein shape of said predetermined feature image is congruent to shape of the expanded area, and wherein said positioning further comprises an alignment step for angularly aligning said detector aperture with said isolated area.

5. A method according to claim 4, wherein said alignment step further comprises a centering step for laterally centering said detector aperture with respect to the image of the isolated area.

6. A method according to claim 5, wherein said isolated area is a substantially square area.

7. A method according to claim 6, wherein said pattern comprises a plurality of isolated areas for measuring a corresponding plurality of stray radiation parameters.

8. A method according to claim 7, wherein said pattern comprises a plurality of substantially square isolated areas for measuring a corresponding plurality of stray radiation parameters.

9. A method of determining a stray radiation condition in a lithographic projection apparatus with a projection system having numerical aperture NA, the method comprising:

supplying a projection beam of radiation having wavelength $\lambda$;

patterning said projection beam according to a pattern comprising a plurality of features;

projecting said patterned beam onto an image plane to create an image of said plurality of features;

providing a detector in a path traversed by said projection beam, said detector having a detector aperture comprising a plurality of transmissive areas that correspond to said plurality of features;

positioning said detector aperture into a position which is substantially coincident with the image plane and wherein the image of said plurality of features covers a corresponding plurality of expanded areas of said detector aperture obtained by a notional dilatation over a distance of at least $\mu$/NA of said plurality of transmissive areas;

measuring detected radiation intensity; and calculating a coefficient representative of the stray radiation condition of said projection system based on said measured radiation intensity.

10. A lithographic projection apparatus comprising:

a radiation system that supplies a projection beam of radiation having wavelength $\lambda$;

a support structure that supports a patterning device configured to pattern said projection beam based on a desired pattern;

a substrate table for holding a substrate;

a projection system, with a numerical aperture NA, that projects said patterned beam onto a target portion of said substrate and to create an image of the pattern;

a detector provided with a detector aperture containing one or more transmissive areas in accordance with the image of one or more features of said pattern, wherein the image of said one or more features is substantially congruent to one or more expanded areas of said detector aperture obtained by a notional dilatation over a distance of at least $\lambda$/NA of said one or more transmissive areas;

a memory device to store parameters representative of stray radiation; and a processor to calculate a stray radiation condition of said projection system.

11. A lithographic projection apparatus according to claim 10, wherein said detector is provided on said substrate table.

* * * * *

UNITED STATES PATENT AND TRADEMARK OFFICE
CERTIFICATE OF CORRECTION

PATENT NO. : 6,862,076 B2
DATED : March 1, 2005
INVENTOR(S) : Mulder et al.

It is certified that error appears in the above-identified patent and that said Letters Patent is hereby corrected as shown below:

Column 13,
Line 2, replace "a distance of at least $\mu$/NA of said plurality of trans-" with
-- a distance of at least $\lambda$/NA of said plurality of trans-. --.

Signed and Sealed this

Eighteenth Day of October, 2005

JON W. DUDAS
*Director of the United States Patent and Trademark Office*